(12) United States Patent
Pai

(10) Patent No.: US 8,975,539 B2
(45) Date of Patent: Mar. 10, 2015

(54) LEAD FRAME PACKAGE STRUCTURE WITH LOW ELECTROMAGNETIC INTERFERENCE

(75) Inventor: Yu-Chang Pai, Hsinchu County (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 14 days.

(21) Appl. No.: 13/414,732

(22) Filed: Mar. 8, 2012

(65) Prior Publication Data
US 2013/0153284 A1 Jun. 20, 2013

(30) Foreign Application Priority Data
Dec. 14, 2011 (TW) .............................. 100146151 A

(51) Int. Cl.
*H01L 23/48* (2006.01)
(52) U.S. Cl.
USPC ............ 174/556; 174/551; 257/676; 257/696
(58) Field of Classification Search
USPC ........... 174/551, 556, 528, 533; 257/676, 696
See application file for complete search history.

(56) References Cited

U.S. PATENT DOCUMENTS

| | | | |
|---|---|---|---|
| 5,157,480 A * | 10/1992 | McShane et al. | 257/693 |
| 5,548,087 A * | 8/1996 | Dahringer | 174/533 |
| 6,552,437 B1 | 4/2003 | Masuda | |
| 6,750,080 B2 | 6/2004 | Masuda | |
| 6,865,804 B2 * | 3/2005 | Youker et al. | 29/846 |
| 2002/0179460 A1 | 12/2002 | Kitamura | |
| 2003/0209810 A1 * | 11/2003 | Moon et al. | 257/784 |

FOREIGN PATENT DOCUMENTS

| TW | 200725861 | 7/2007 |
|---|---|---|
| TW | 200933849 | 8/2009 |

* cited by examiner

*Primary Examiner* — Hung V Ngo
(74) *Attorney, Agent, or Firm* — Winston Hsu; Scott Margo

(57) ABSTRACT

A lead frame package structure with low EMI includes at least a die holder each for supporting a die, and at least a lead frame each including a first terminal for connecting a printed circuit board, a second terminal for connecting the die, and a lead for connecting the first terminal and the second terminal, wherein the height of the lead is lower than the height of the first terminal and the second terminal.

3 Claims, 9 Drawing Sheets

LEAD FRAME PACKAGE STRUCTURE WITH LOW ELECTROMAGNETIC INTERFERENCE

BACKGROUND OF THE INVENTION

1. Field of the Invention

The present invention relates to a lead frame package structure, and more particularly, to a lead frame package structure with low electromagnetic interference and low crosstalk.

2. Description of the Prior Art

There are several package types for an integrated circuit (IC) according to different materials of a die holder of the IC, such as lead frame package, laminate substrate package, tape package and ceramic package. Since the lead frame package has low cost and low speed signal transmission, the lead frame package is not suitable for high speed signal transmission interface such as DDR3-1333 Mbps, HDMI or USB3.

Please refer to FIG. 1 to FIG. 3, FIG. 1 is an appearance diagram of a traditional lead frame package structure 10, FIG. 2 is a top view of the lead frame package structure 10, and FIG. 3 is a side view of the lead frame package structure 10. As shown in FIG. 1 and FIG. 2, the lead frame package structure 10 includes a plurality of lead frames 100 and a die 11. The lead frame 100 includes an outer pin 102, an inner pin 104 and a lead 106. The outer pin 102 is electrically connected to a printed circuit board (PCB), which is not shown in FIG. 1 and FIG. 2, the inner pin 104 is electrically connected to die 11 by soldering, e.g. a gold wire 103 shown in FIG. 2, and the lead 106 is connected between the inner pin 102 and the outer pin 104. As shown in FIG. 3, the lead frame package structure 10 further includes a holder 12 for supporting the die 11 and a molding 13 for covering the lead frame 100 and the die 11.

According to above description, the lead frame package structure 10 is not a multi-layer structure to design a reference ground plane as a printed circuit board does, which results in difficult impedance control, signal crosstalk and high loop inductance of a power distribution network (PDN). In order to solve above disadvantages, in the prior art, the lead frame package structure 10 disposes ground lines between each lead frames 100. However, the added ground lines occupy the pins for disposing the lead frames 100, causing a number of signal pin out decrease.

SUMMARY OF THE INVENTION

It is therefore an object of the present invention to provide a lead frame structure for solving above problems.

The present invention discloses a lead frame package structure with low EMI. The lead frame package structure includes at least a die holder each for supporting a die, and at least a lead frame each including a first terminal for connecting a printed circuit board, a second terminal for connecting the die, and a lead for connecting the first terminal and the second terminal, wherein the height of the lead is lower than the height of the first terminal and the second terminal.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
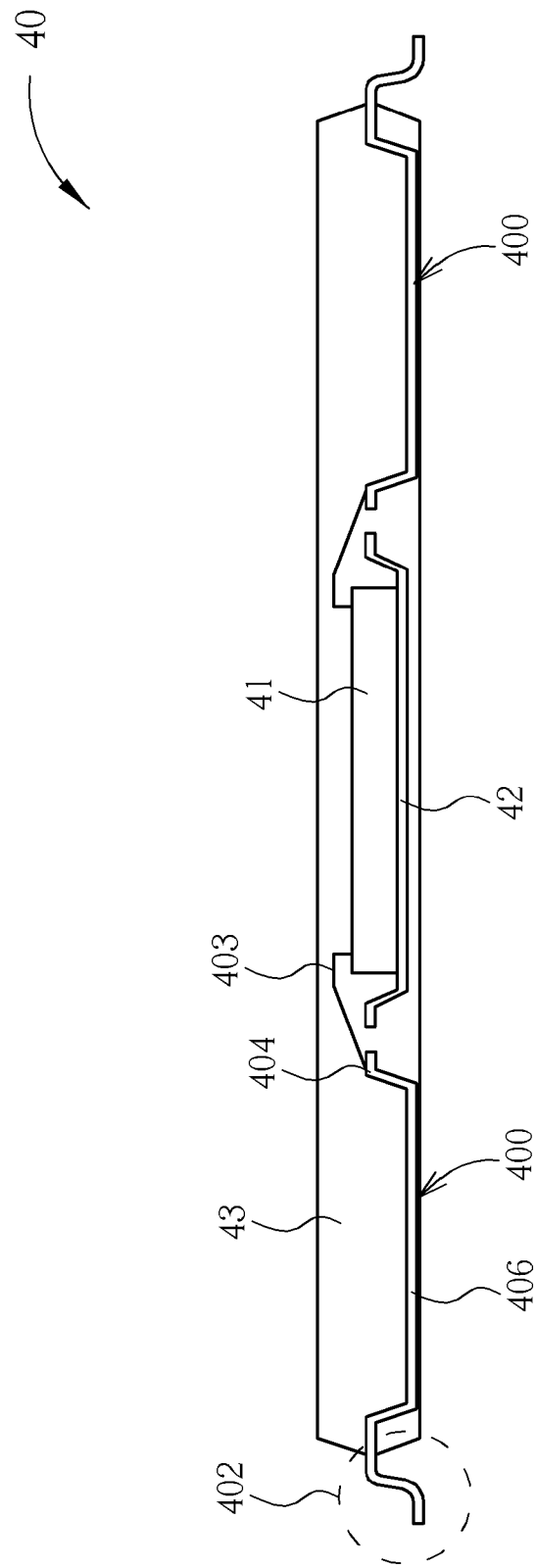
FIG. 4 is a schematic diagram of a lead frame package structure according to an embodiment of the present invention.

Please refer to FIG. 4, which is a schematic diagram of a lead frame package structure 40 according to an embodiment of the present invention. The lead frame package structure 40 includes a lead frame 400, a die 41, a holder 42 and a molding 43. The lead frame 400 includes an outer pin 402, an inner pin 404 and a lead 406. The outer pin 402 is electrically connected to a printed circuit board (PCB), which is not shown in FIG. 4, the inner pin 404 is electrically connected to the die 41 through a gold wire 403, and the lead 406 is electrically connected between the inner pin 402 and the outer pin 404. The holder 42 is used for supporting the die 41. The molding 43 is used for covering the lead frame 400 and the die 41. In this embodiment, the outer pin 402 may be a Gull-Wing pin.

Figure 1:
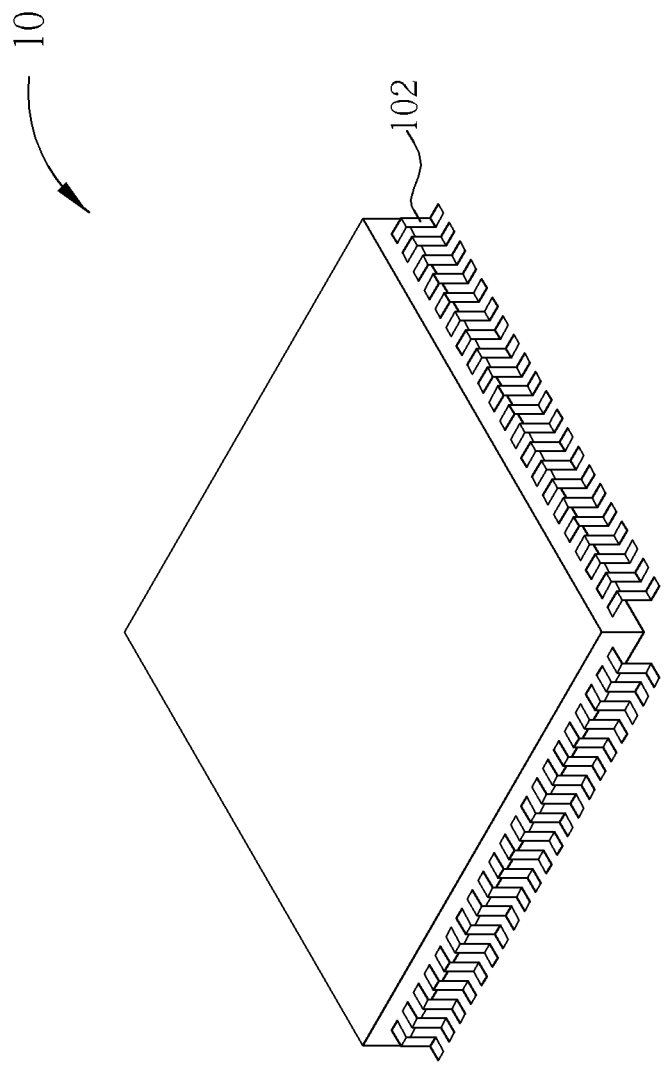
FIG. 1 is an appearance diagram of a traditional lead frame package structure.
Figure 2:
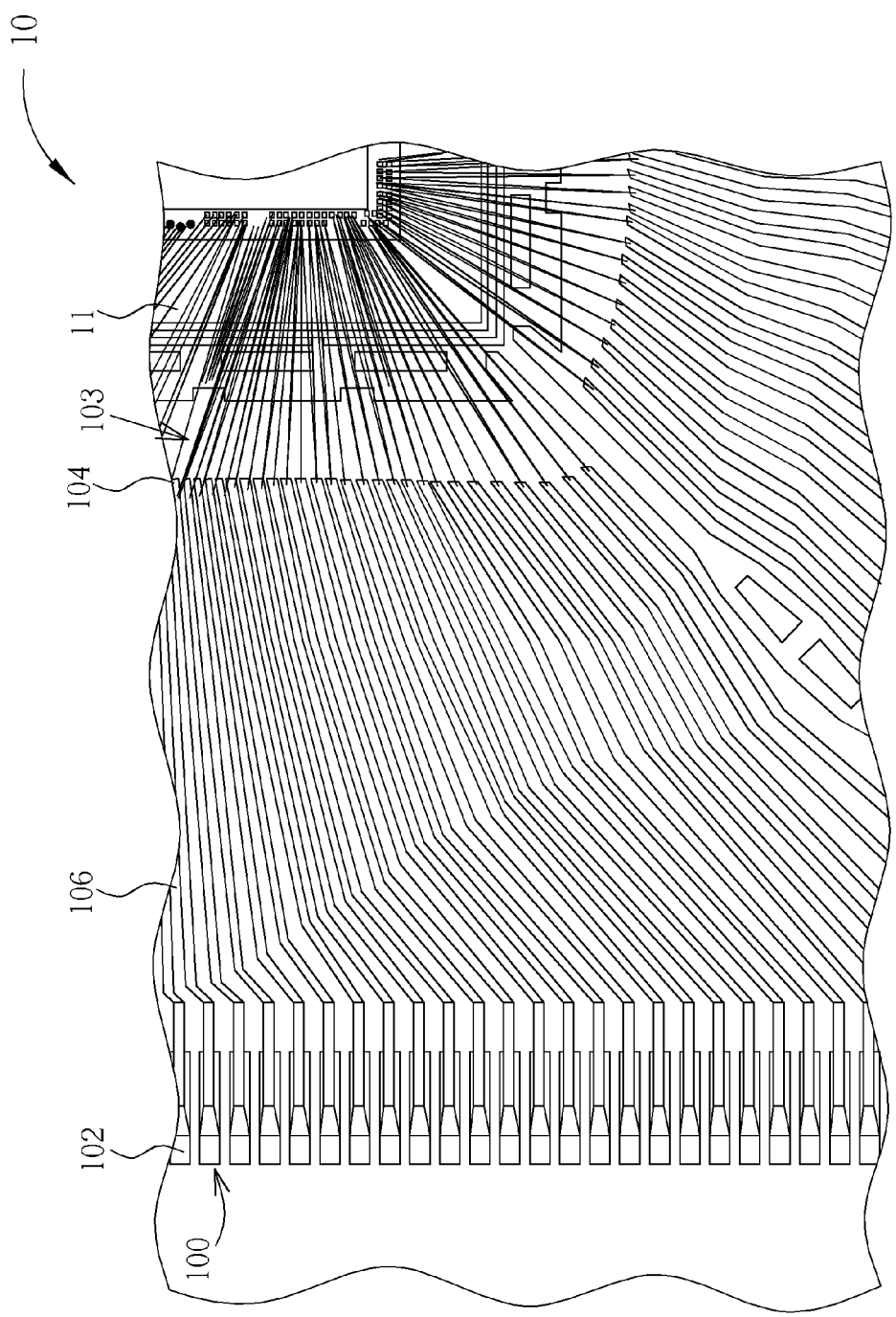
FIG. 2 is a top view of the lead frame package structure shown in FIG. 1.
Figure 3:
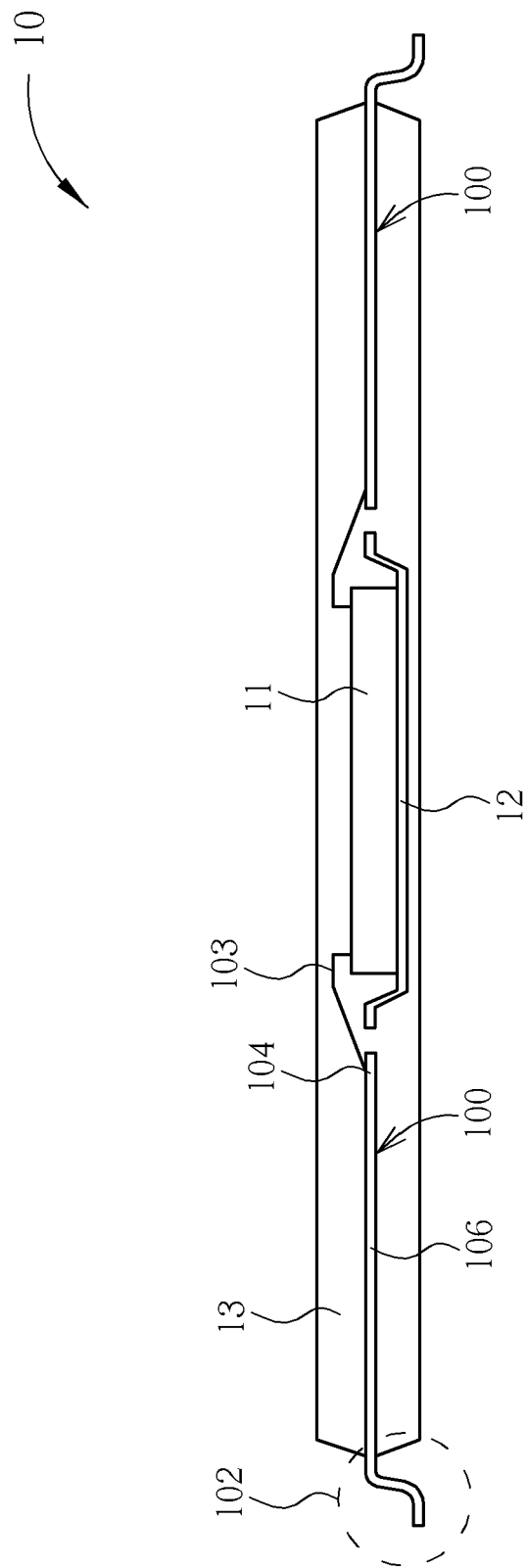
FIG. 3 is a side view of the lead frame package structure shown in FIG. 1.
Figure 5:
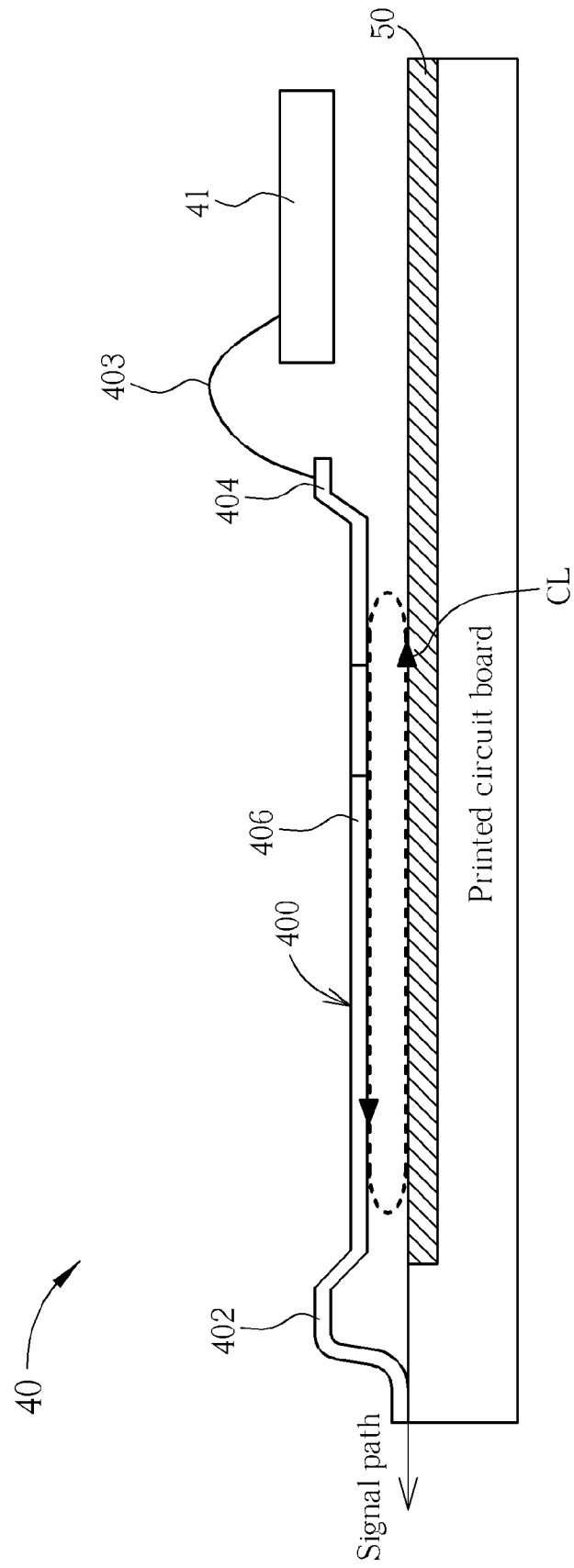
FIG. 5 is a schematic diagram of the lead frame package structure disposed on the PCB according to an embodiment of the present invention.

Noticeably, a height of the lead 406 is lower than heights of the outer pin 402 and the inner pin 404, such that the lead 406 forms a U-shape. Please compare FIG. 3 with FIG. 4 at once, which clearly shows the lead 406 has the U-shape compared with the traditional lead 106. Please refer to FIG. 5, which is a schematic diagram of the lead frame package structure 40 disposed on the PCB according to an embodiment of the present invention. As shown in FIG. 5, when the lead frame package structure 40 is disposed on the PCB, the lead 406 is closer to a ground plane 50 of the PCB comparing with the traditional lead 106. Therefore, a current loop CL formed by signals flowing on the lead 406 turns to flow under the lead 406, such that the signal crosstalk may be mitigated. Furthermore, since the lead 406 is closer to the ground plane 50 of the PCB, an electronic filed generated from the lead 406 mostly distributes between the lead 406 and the ground plane 50, and thus reduces influence around the lead frame 400 and mitigates electromagnetic interference (EMI). In short, the lead frame package structure 40 utilizes the ground plane 50 of the PCB as a reference ground of the lead frame 400 to reduce signal crosstalk and EMI.

Figure 6:
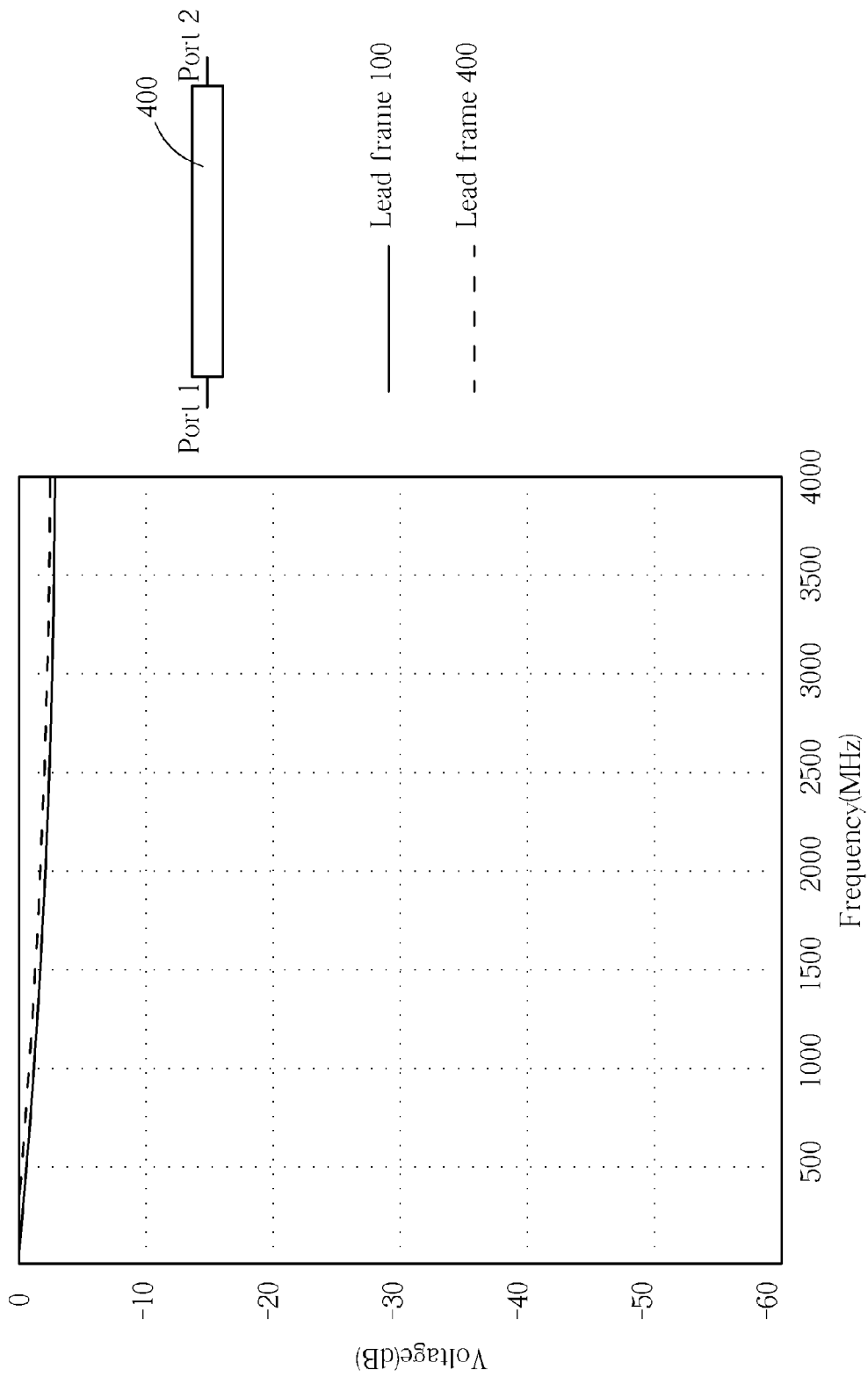
FIG. 6 is a schematic diagram of a signal insertion loss according to an embodiment of the present invention.
Figure 7:
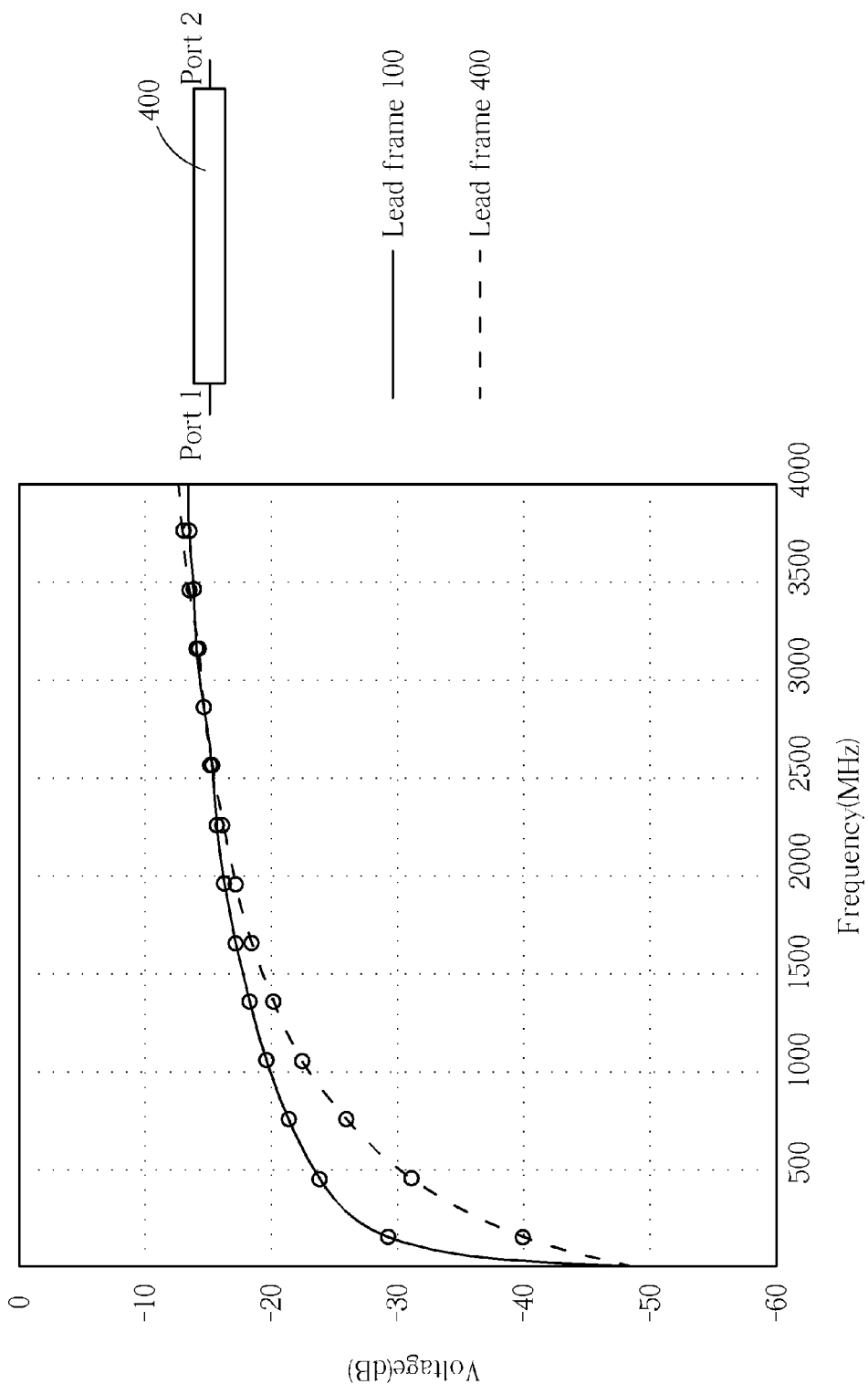
FIG. 7 is a schematic diagram of a signal return loss according to an embodiment of the present invention.
Figure 8:
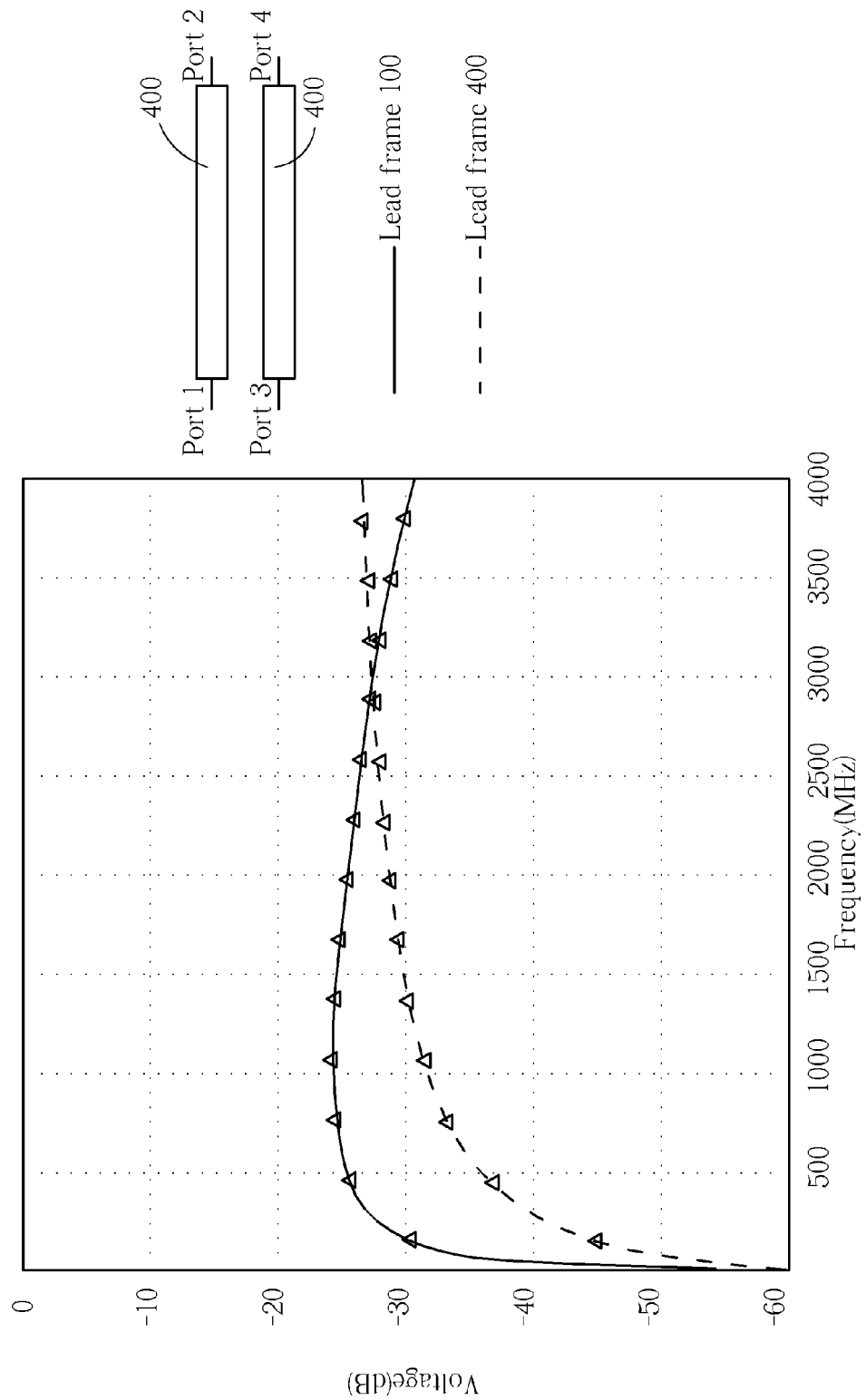
FIG. 8 is a schematic diagram of a far-end crosstalk according to an embodiment of the present invention.
Figure 9:
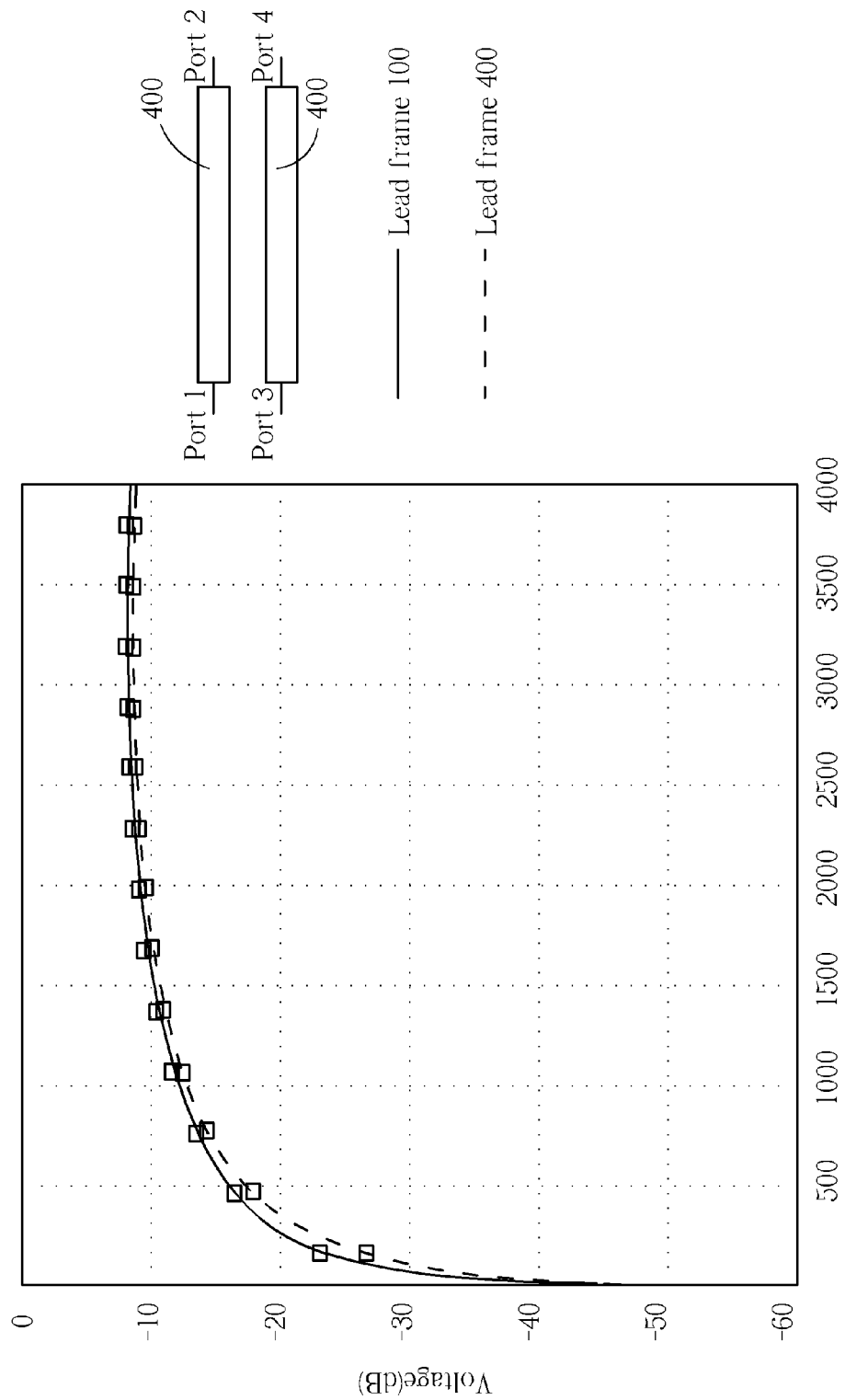
FIG. 9 is a schematic diagram of a near-end crosstalk according to an embodiment of the present invention.

Please refer to FIG. 6 to FIG. 9, FIG. 6 is a schematic diagram of a signal insertion loss according to an embodiment of the present invention. FIG. 7 is a schematic diagram of a signal return loss according to an embodiment of the present invention. FIG. 8 is a schematic diagram of a far-end crosstalk according to an embodiment of the present invention. FIG. 9 is a schematic diagram of a near-end crosstalk according to an embodiment of the present invention. In FIG. 6, assumed that the signal is transmitted from a first terminal Port 1 of the lead frame 400 to the second terminal Port 2 of the lead frame 400. As shown in FIG. 6, comparing with the structure of the traditional lead frame 100, the signal insertion loss of the lead frame 400 is lower than that of the traditional lead frame 100. In FIG. 7, comparing with the lead frame 100, the signal return loss at the first terminal Port 1 of the lead frame 400 is lower than that of the traditional lead frame 100 as well. For example, below 3000 MHz, the signal return loss of the frame 400 substantially decreases 6 dB. Further more, in FIG. 8, assumed that the signal is transmitted from the first terminal Port 1 to the second terminal Port 2 of the lead frame 400. The other lead frame 400 closest to the lead frame 400 suffers crosstalk in the lead frame package structure 40; as for another lead frame 400, in the crosstalk phenomenon, a third terminal Port 3 close to the first terminal Port 1 of the lead frame 400 is called near-end, while a fourth terminal Port 4 far from the first terminal Port 1 is called far-end in the crosstalk phenomenon. As shown in FIG. 8, comparing with the lead frame 100, the far-end crosstalk of the lead frame 400 is lower than that of the traditional lead frame 100. For example, below 1500 MHz, the far-end crosstalk substantially decreases 10 dB. Moreover, in FIG. 9, the near-end crosstalk of the lead frame 400 is lower than that of the traditional lead frame 100, e.g. the near-end crosstalk substantially decreases 3 dB below 1500 MHz.

According to above description, the lead 106 of the traditional lead frame 100 is horizontally connected between the inner pin 104 and the outer pin 10, so that the lead 106 can not close to the ground plane of the PCB resulting in serious crosstalk and EMI problems. In comparison, the lead 406 of the lead frame 400 connects the inner pin 104 and the outer pin 102 with the low profiled U-shape, such that the lead frame 400 is closer to the ground plane to effectively reduce crosstalk and EMI. Noticeably, the outlooks of the lead frame package structure 40 and the traditional lead frame package structure are the same, and thus no new mold is needed for the present invention to save production cost. For example, after the lead frame 100 is made, the U-shaped lead 406 is formed by performing a stamping process to the lead 106.

To sum up, in contrast to the traditional lead frame structure, the present invention provides a new lead frame package structure, in which the lead frame has the U-shape to close to the ground plane of the printed circuit board to effectively reduce loop inductance and mitigate crosstalk and EMI.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A lead frame package structure with low EMI, comprising:
    at least one die holder, for supporting a die; and
    at least one lead frame, each including a first terminal for connecting a printed circuit board, a second terminal for connecting to the die through a gold wire, and a lead for connecting the first terminal and the second terminal;
    wherein, the lead has a length from the first terminal to the gold wire;
    wherein, within the length, a height of the lead is lower than a height of the first terminal and a height of the gold wire, such that a ground plane of the printed circuit board is utilized as a reference ground of the lead frame to reduce EMI;
    wherein the first terminal is a Gull-Wing pin.

2. The lead frame package structure of claim 1, wherein the height of the lead that lower than the heights of the first terminal and the second terminal is formed via a stamping process.

3. The lead frame package structure of claim 1, wherein the second terminal connects to the die via soldering.

* * * * *